METHOD OF PROCESSING SEMICONDUCTOR DEVICES

Filed July 14, 1958

INVENTORS
GERALD M. BESTLER
THEODORE W. MINER
BY Orrin M. Haugen
ATTORNEY

United States Patent Office 2,900,287

Patented Aug. 18, 1959

2,900,287

METHOD OF PROCESSING SEMICONDUCTOR DEVICES

Gerald M. Bestler and Theodore W. Miner, Richfield, Minn., assignors to Minneapolis-Honeywell Regulator Company, Minneapolis, Minn., a corporation of Delaware Application July 14, 1958, Serial No. 748,369

4 Claims. (Cl. 148—1.5)

The present invention relates generally to an improved method for preparation of alloyed semiconductor junction devices and relates specifically to a single stage operation for attaching ohmic contacts thereto as well as preparing one or more alloyed junctions therein. According to the present invention, improved and progressive wetting occurs between the semiconductor crystal and the molten alloy impurity substance while the junction preparation is underway. The invention is adaptable to use with crystalline semiconductor bodies such as germanium, silicon, or the like.

According to the present invention, preparation of an alloyed junction or junctions and an ohmic electrical connection to the semiconductor are accomplished simultaneously. Initially, the alloyed impurity is retained in a cavity and held in spaced relationship with the semiconductor crystal by a layer of fusible material which melts at a temperature higher than the melting point of the alloyed impurity material. A downward force is applied against the semiconductor crystal in order to urge the crystal assembly into contact with the already fused or molten alloy junction impurity material when the spacing layer fuses. In order to arrange physical contact between the fused alloyed material and the semiconductor crystal, a depression cavity is provided having an open port or top which permits the surface tension of the molten alloy impurity material to raise the top surface thereof above the plane of the horizontal supporting surface.

Gradual and uniform wetting of the semiconductor crystals from the center of the junction outwardly is accomplished according to this procedure. Thus, entrained gases or the like do not present a problem and more completely wetted junction areas are formed to the exclusion of gas voids, blow holes or the like, even though the alloy material may be situated beneath the semiconductor crystal.

It is therefore an object of the present invention to provide an improved method for simultaneously preparing one or more alloyed junctions together with an ohmic contact or contacts on a crystalline semiconductor body.

It is a further object of the present invention to prepare improved alloyed junctions in semiconductor bodies which are characterized by uniform and complete wetting of the crystal by the alloy impurity material.

It is yet another object of the present invention to provide progressive contact or wetting between the semiconductor crystal and the alloyed impurity in such a fashion that physical contact is not established until the alloyed impurity is at a temperature substantially above the melting point thereof, but below the temperature at which plastic deformation of the germanium crystal will occur.

Other and further objects will become apparent to those skilled in the art upon a reading of the following specification, appended claims, and accompanying drawings, wherein:

Figure 1:
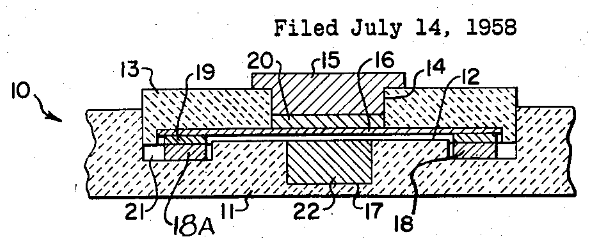
Figure 1 is a vertical sectional view partially broken away of a semiconductor processing assembly in one stage of the operation and in which the unit is being prepared in accordance with the present invention, this figure being taken along the lines in the direction of the arrows 1—1 of Figure 3.
Figure 2:
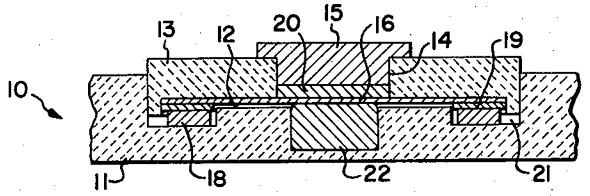
Figure 2 is a view similar to Figure 1 showing the apparatus in a further stage of progress according to the improved methods of the present invention.
Figure 3:
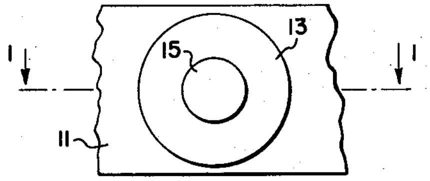
Figure 3 is a top plan view of an apparatus prepared in accordance with the present invention.
Figure 4:
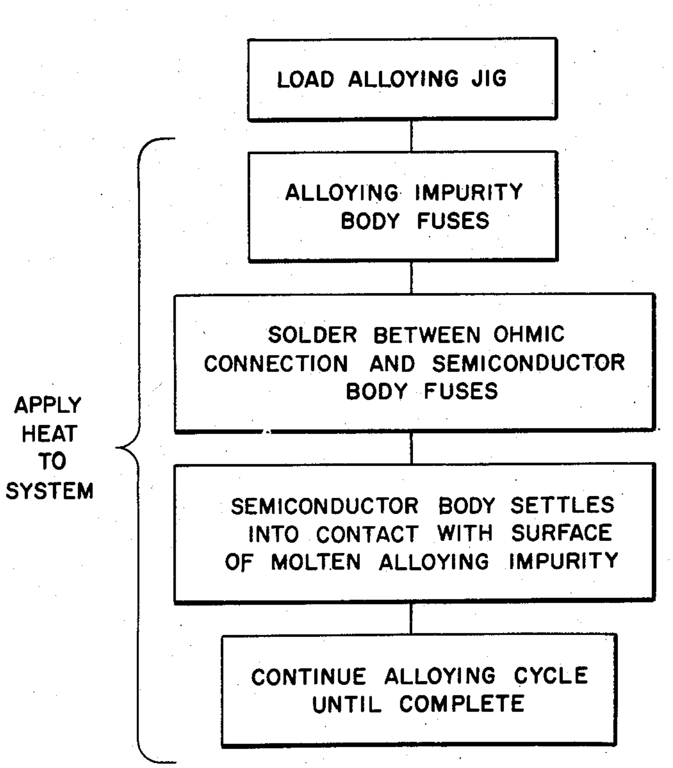
Figure 4 is a schematic diagrammatic block form showing a series of steps for preparing alloyed junctions in semiconductor bodies in accordance with the present invention.

Reference is made to Figures 1 and 2 wherein an apparatus or jig for carrying out the preferred modification of the present invention is shown. These jigs or the like may be made in multiple form wherein a series of enclosures are available for production of a plurality of units simultaneously or they may be made in individual form. For high production techniques however, it is preferable that they be made in multiple form and hence the units are shown broken away in such a fashion as would be expected in a multiple jig. The jig generally designated 10 includes a base 11 having a supporting face 12, and a cover member 13 with an opening 14 arranged to receive an alloying charge and a weight and being further arranged to guide metal weight 15 along a vertical path toward a semiconductor wafer during alloying cycle. The alloying enclosure is arranged to receive a crystalline semiconductor wafer 16 along with alloying impurity 17, and ohmic contact assembly 18 which includes a non-fusible base ring 18A and fusible solder spacer 19. In addition to being arranged to receive the weight 15, cover member 13 is also arranged to receive the second alloyed impurity pellet 20 as stated generally above.

In carrying out the process of the present invention, the graphite jig member 10 is initially provided with an ohmic base ring of nickel, Kovar or the like 18, along with a suitable solder ring of co-extensive angular dimension 19. When indium is employed as the alloyed material in the semiconductor arrangement, it is preferred to use a solder melting such as for example at 370° F. such as a solder consisting of 63% lead, 35% tin, and 2% antimony. Dimensionally, the solder ring 19 must have a thickness greater than the difference between the depth of the base ring receiving groove 21 and the transverse thickness of the base ring 18A. Therefore, the solder ring 19 is arranged to support the semiconductor at a level above the supporting face 12. An alloyed impurity pellet 17 made from indium or other suitable alloying material is placed within the depression cavity 22 of the jig 10. It is essential that the volume of this pellet be substantially equal to the volume of the impression cavity 22 in order that upon fusion thereof the surface tension of the material will cause the surface to rise above the level of the support face 12. This is illustrated in Figure 2 of the drawings. At this point, a semiconductor wafer 16 is placed in the assembly and is supported therein by the solder ring 19 at the level above that support 12. At this point the second alloyed impurity pellet 20 is placed within the chamber 14 of the jig and weight 15 is set thereupon. The assembly is then ready to be loaded into a suitable heating chamber and the fabrication process may be carried out in a single-step operation.

It will be understood that it is not essential to prepare two junctions in a crystal at the same time and that the present invention is equally adaptable to preparation of the devices with a single junction thereon such as a rectifier assembly or the like. Accordingly, the top junction will be omitted and the unit so produced will include a base ring together with a single junction on a single surface of the semiconductor wafer.

In order to more fully comprehend the invention herein, a specific example will be given as follows:

*Example 1*

In a graphite alloying jig, there was placed a nickel ring having an I.D. of .265", and O.D. or .320" and a thickness of 3 mils. The depth of the annular receiving chamber 21 in the jig 10 was 6 mils. A solder ring having substantially identical dimensions with the Kovar ring with the exception of being 6 mils thick was then superimposed upon the Kovar ring. An indium pellet having a thickness of 24 mils and a diameter of .125" was placed in the chamber 22, the top surface being flush with the supporting face of the jig 10. This pellet substantially filled the chamber 22, close dimensional tolerances being maintained. A rectangular N-type germanium semiconductor wafer was then placed in the jig, this wafer having a length and width of .280" and a thickness of 6 mils. A second cylindrical indium pellet having a diameter of .145" and thickness of 24 mils was then placed on top of the germanium wafer and cover 13 and weight 15 were then superimposed on the assembly. The loaded jig was then placed in an oven and the temperature was raised to circa. 900° F. and maintained thereat for a period of 15 minutes after which the jig was permitted to cool back to room temperature. Sequentially, the events which occur are initially a fusion of the indium pellet 17, this being followed by a fusion of the annular solder ring 19. Upon fusing of the solder ring 19, the force of the weight 15 exerted against the fused solder ring causes a plastic flow to occur in the solder ring together with a consequent settling of the cap and semiconductor wafer, the wafer coming into contact with the indium pellet 17. Of course, the surface tension of the indium pellet 17 has previously caused the top surface of the pellet to be elevated above the top surface of the supporting face 12 and to assume a convex configuration relative to the semi-conductor wafer. Contact is then made progressively from the center of the indium pellet outwardly and there is substantially no opportunity for entrained gases or the like to cause a discontinuity in the wetting of the germanium disc by the indium pellet. Thus, it is seen that in a single heating step, improved alloyed junction transistors may be fabricated, this being accomplished with a minimum of skilled supervision.

It will be appreciated that those skilled in the art may carry out the features of the present invention according to various modifications thereof without actually departing from the spirit or the scope of the present invention. It will be understood, therefore, that there is no intention to limit the scope of the present application to the specific example given herewith.

We claim:

1. The method of preparing alloyed junctions in a crystalline semiconductor which comprises the steps of providing an alloying enclosure having a horizontally disposed supporting surface and at least two spaced depression cavities arranged thereunder and communicating therewith, loading a first depression cavity with a predetermined volume of a fusible impurity substance having a certain first melting temperature, said volume being substantially equal to the volume of said depression cavity, placing an ohmic contact assembly which includes a second fusible body portion in the second depression cavity, said second body having a thickness dimension which is in excess of the difference between the depth of said second cavity and the thickness of a non-fusible portion of said ohmic contact member, and having a second melting temperature which is in excess of said first melting temperature, placing a crystalline semiconductor wafer in said enclosure which substantially covers said first and said second fusible members and which is maintained in spaced relationship from said supporting surface, heating said assembly to an elevated temperature which is in excess of said second predetermined temperature and maintaining said elevated temperature for a period of time sufficient to fuse said fusible substances and thereby bring said crystalline semiconductor wafer into physical contact with said first fusible metal, and thereby accomplish preparation of an alloy junction between said semiconductor crystal and said fusible impurity substance.

2. A method of preparing alloyed junctions in a crystalline semiconductor body which comprises the steps of providing an alloying enclosure having a horizontally disposed supporting surface and at least two spaced depression cavities arranged thereunder and communicating therewith, loading a first depression cavity with a predetermined volume of a metallic substance consisting essentially of indium, said volume being substantially equal to the volume of said depression cavity, placing an ohmic contact member assembly which includes a second fusible metal body portion in a second depression cavity, said second fusible body having a thickness dimension which is in excess of the difference between the depth of said second cavity and thickness of a non fusible portion of said ohmic contact member, and having a second melting temperature which is in excess of said first melting temperature, placing a crystalline semiconductor wafer in the said enclosure which extends over said first and said second cavities and which is contained in spaced relationship from said supporting surfaces, heating said assembly to an elevated temperature which is in excess of said second predetermined temperature, and maintaining said elevated temperature for a period of time sufficient to fuse said fusible substances and accomplish preparation of an alloyed junction between said semiconductor wafer and said fusible impurity substance.

3. The method of claim 2 being particularly characterized in that said second fusible metal body consists essentially of 63% lead, 35% tin, and 2% antimony.

4. The method of preparing alloyed junctions in a crystalline semiconductor body taken from the class consisting of germanium and silicon which comprises steps of providing an alloying enclosure having a horizontally disposed supporting surface and at least two spaced depression cavities arranged thereunder and communicating therewith, loading said first cavity with a body of a certain alloying composition having a certain volume, said alloying composition being of the class of composition of rendering said crystalline semiconductor body of a certain conductivity type when alloyed therewith, said volume being substantially equal to the volume of the said first depression cavity, the surface tension of the said alloying composition being arranged to hold at least a surface portion of said alloying body above said supporting surface when molten, loading a second cavity with an ohmic contact assembly including a non-fusible portion and having a thickness which is less than the depth of said second cavity and a second fusible body portion of a certain composition having a melting point which is at a significantly higher temperature than the melting point of said alloying composition, the thickness of said second fusible substance being greater than the difference between the depth of said second cavity and the thickness of said non-fusible portion, applying pressure against said crystal toward said cavities, heating said assembly to fuse said fusible substances and bring a preselected surface portion of said semiconductor crystal into contact with said first fusible mass to form an alloyed junction therewith.

No references cited.